United States Patent
Naka et al.

(10) Patent No.: US 12,278,647 B2
(45) Date of Patent: Apr. 15, 2025

(54) A/D CONVERTER AND SENSOR SYSTEM INCLUDING THE SAME

(71) Applicant: Panasonic Intellectual Property Management Co., Ltd., Osaka (JP)

(72) Inventors: Jun'ichi Naka, Osaka (JP); Koji Obata, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 257 days.

(21) Appl. No.: 18/245,815

(22) PCT Filed: Jun. 10, 2021

(86) PCT No.: PCT/JP2021/022167
§ 371 (c)(1),
(2) Date: Mar. 17, 2023

(87) PCT Pub. No.: WO2022/064787
PCT Pub. Date: Mar. 31, 2022

(65) Prior Publication Data
US 2023/0344442 A1    Oct. 26, 2023

(30) Foreign Application Priority Data
Sep. 28, 2020   (JP) ................ 2020-162652

(51) Int. Cl.
*H03M 1/12*     (2006.01)
*H03M 1/46*     (2006.01)
*G01P 1/00*     (2006.01)

(52) U.S. Cl.
CPC ........... *H03M 1/46* (2013.01); *G01P 1/00* (2013.01)

(58) Field of Classification Search
CPC .... H03M 1/468; H03M 3/426; H03M 1/0854; H03M 1/0626; H03M 3/458;
(Continued)

(56) References Cited

U.S. PATENT DOCUMENTS 7,224,305 B2 * 5/2007 Haartsen ................ H03M 1/04
                                                  341/131
9,197,240 B1 * 11/2015 Kinyua ............... H03M 1/0626
(Continued)

FOREIGN PATENT DOCUMENTS

JP    2017-147712 A    8/2017
JP    2018-152839 A    9/2018
(Continued)

OTHER PUBLICATIONS

International Search Report dated Aug. 24, 2021 issued in International Patent Application No. PCT/JP2021/022167, with English translation.
(Continued)

*Primary Examiner* — Linh V Nguyen
(74) *Attorney, Agent, or Firm* — Rimon P.C.

(57) ABSTRACT

A D/A converting unit generates a comparative voltage corresponding to a target bit falling within a range from a most significant bit through a least significant bit. A comparator determines a value of the target bit by comparing a differential voltage between an output signal of an input switching unit and a comparative voltage generated by the D/A converting unit with a reference voltage. An integrator integrates a conversion error. In a first conversion operation of converting a first signal, a control unit sets, based on a result obtained by the integrator, the reference voltage for use when the first signal to be provided next time as the output signal by the input switching unit is A/D converted. In a second conversion operation of A/D converting a
(Continued)

second signal, the control unit sets the reference voltage at a constant voltage level.

20 Claims, 7 Drawing Sheets

(58) Field of Classification Search
CPC ........ H03M 1/462; H03M 1/46; H03M 1/466; H03M 3/46; H03M 1/12; H03M 1/1245; H03M 1/00; H03M 1/06; H03M 1/662; H03M 3/454; H03M 1/1205; H03M 1/40; H03M 1/442; H03M 1/44; H03M 3/37; H03M 3/414
USPC ......... 341/118–120, 143, 155, 161, 162, 172
See application file for complete search history.

(56) References Cited

U.S. PATENT DOCUMENTS

| | | | |
|---|---|---|---|
| 11,424,754 B1* | 8/2022 | Berens | H03M 1/1057 |
| 2016/0352351 A1* | 12/2016 | Miki | H03M 1/0626 |
| 2017/0317683 A1 | 11/2017 | Bandyopadhyay et al. | |
| 2018/0160066 A1 | 6/2018 | Matsuzawa et al. | |
| 2019/0131989 A1* | 5/2019 | Maurino | H03M 3/452 |
| 2019/0182445 A1 | 6/2019 | Canniff et al. | |
| 2020/0119744 A1* | 4/2020 | Lin | H03M 1/0854 |
| 2021/0119637 A1* | 4/2021 | Lin | H03M 1/1245 |
| 2021/0359698 A1* | 11/2021 | Sun | H03M 1/468 |
| 2022/0209781 A1* | 6/2022 | Huang | H03M 1/1215 |
| 2022/0407530 A1* | 12/2022 | Strandvik | H03M 1/0626 |
| 2023/0291413 A1* | 9/2023 | Park | H03M 1/38 |
| 2024/0137040 A1* | 4/2024 | Sanyal | H03M 1/60 |

FOREIGN PATENT DOCUMENTS

| | | |
|---|---|---|
| JP | 2019-106706 A | 6/2019 |
| WO | 2020/170617 A1 | 8/2020 |

OTHER PUBLICATIONS

Extended European Search Report dated Feb. 20, 2024 issued in the corresponding European Patent Application No. 21871920.1.
Bos Thomas et al. Jun. 25, 2017 (Jun. 25, 2017). "An 8-11b 320kS/s Resolution Scalable Noise Shaping SAR ADC". 2017 15th IEEE International New Circuits and Systems Conference (NEWCAS), pp. 209-212.

* cited by examiner

A/D CONVERTER AND SENSOR SYSTEM INCLUDING THE SAME

CROSS-REFERENCE OF RELATED APPLICATIONS

This application is the U.S. National Phase under 35 U.S.C. § 371 of International Patent Application No. PCT/JP2021/022167, filed on Jun. 10, 2021, which in turn claims the benefit of Japanese Patent Application No. 2020-162652, filed on Sep. 28, 2020, the entire disclosures of which Applications are incorporated by reference herein.

TECHNICAL FIELD

The present disclosure generally relates to an analog-to-digital (A/D) converter and a sensor system including the A/D converter, and more particularly relates to a successive approximation register (SAR) A/D converter and a sensor system including such an A/D converter.

BACKGROUND ART

Patent Literature 1 discloses a noise-shaping SAR A/D converter. The noise-shaping SAR A/D converter has a configuration in which an integrating circuit is provided as an additional constituent element for a normal SAR A/D converter. In the noise-shaping SAR A/D converter, after a successive approximation operation has been performed through the least significant bit, the residual voltages of a digital-to-analog converter (DAC) are integrated, and the resultant integrated value is fed back when sampling is performed next time, thus achieving a noise-shaping characteristic for shifting noise in a low-frequency band to a high-frequency band. Then, Patent Literature 1 enables increasing the resolution of the A/D converter by having the noise that has been shifted to the high-frequency band attenuated by a low-pass filter.

If an A/D converter is configured to A/D convert a plurality of signals, then a plurality of integrating circuits (integrators) and low-pass filters need to be provided for the plurality of signals, respectively, thus causing a significant increase in the overall size of the A/D converter.

CITATION LIST

Patent Literature

Patent Literature 1: JP 2017-147712 A

SUMMARY OF INVENTION

It is therefore an object of the present disclosure to provide an A/D converter which may have a reduced size and a sensor system including such an A/D converter.

An A/D converter according to an aspect of the present disclosure includes a first input terminal, a second input terminal, an input switching unit, and a successive approximation register A/D converting section. The first input terminal receives a first signal. The second input terminal receives a second signal. The input switching unit provides an output signal selected from the group consisting of the first signal received at the first input terminal and the second signal received at the second input terminal. The A/D converting section performs A/D conversion of converting the output signal of the input switching unit into a multi-bit digital signal. The A/D converting section includes a D/A converting unit, a comparator, an integrator, and a control unit. The D/A converting unit generates a comparative voltage corresponding to a target bit falling within a range from a most significant bit through a least significant bit. The comparator determines a value of the target bit by comparing a differential voltage between the output signal of the input switching unit and the comparative voltage with a reference voltage. The integrator integrates a conversion error after the comparator has performed a successive approximation operation through the least significant bit. In a first conversion operation of A/D converting the first signal, the control unit sets, based on a result of integration obtained by the integrator after the first signal provided last time as the output signal by the input switching unit has been A/D converted, the reference voltage for use when the first signal to be provided next time as the output signal by the input switching unit is A/D converted. In a second conversion operation of A/D converting the second signal, the control unit sets the reference voltage at a constant voltage level.

A sensor system according to another aspect of the present disclosure includes: a sensor that outputs a result of detection of a target event; and the A/D converter described above. A sensor signal provided by the sensor is supplied as the first signal to the first input terminal.

DESCRIPTION OF EMBODIMENTS

Embodiment (1) Overview

Figure 1:
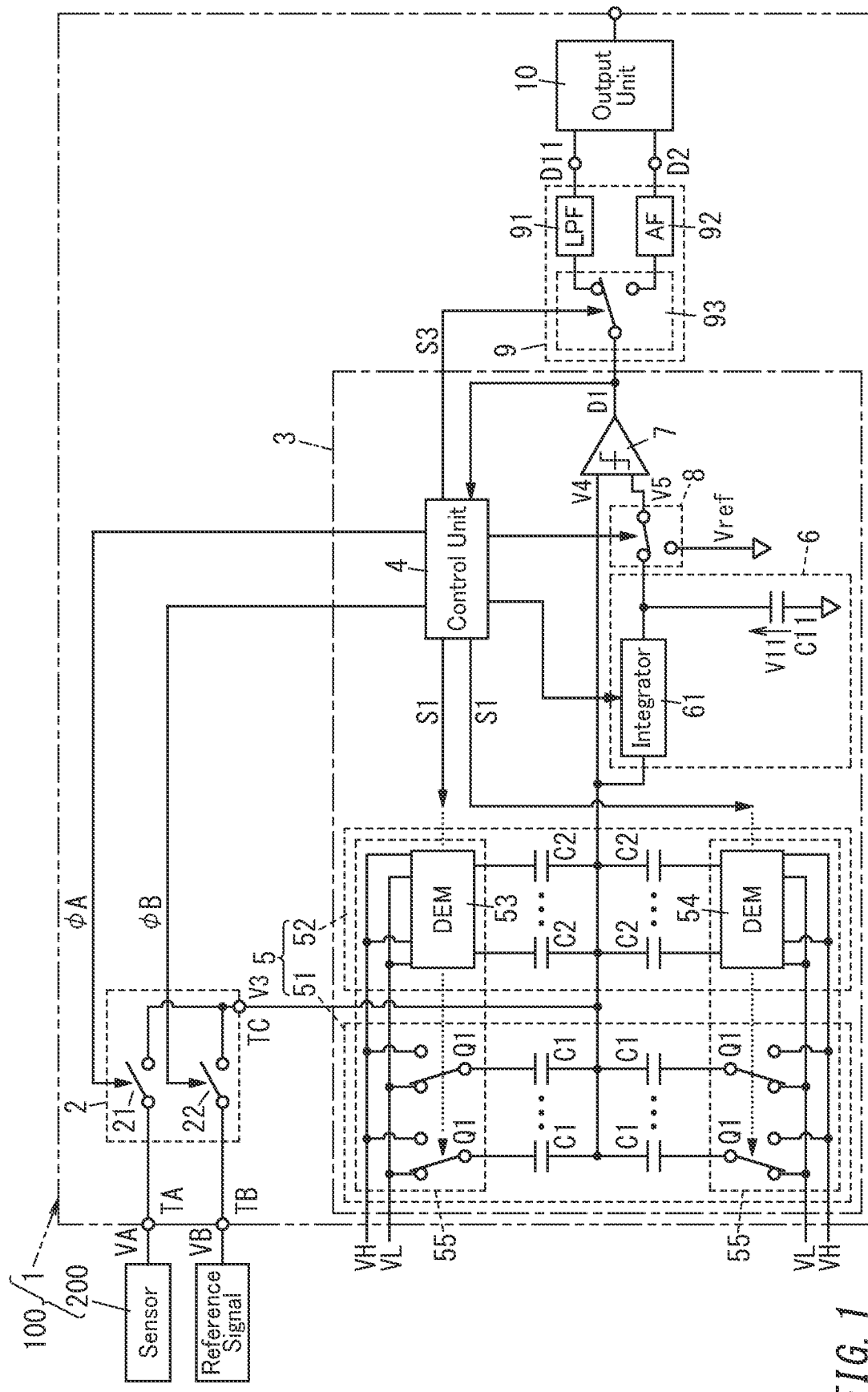
FIG. 1 is a schematic circuit diagram of an A/D converter according to an exemplary embodiment of the present disclosure.

As shown in FIG. 1, an A/D converter 1 according to an exemplary embodiment includes a first input terminal TA, a second input terminal TB, an input switching unit 2, and a successive approximation register A/D converting section 3.

The first input terminal TA receives a first signal VA.

The second input terminal TB receives a second signal VB.

The input switching unit 2 provides an output signal V3 selected from the group consisting of the first signal VA received at the first input terminal TA and the second signal VB received at the second input terminal TB.

The A/D converting section 3 performs A/D conversion of converting the output signal V3 of the input switching unit 2 into a multi-bit digital signal.

The A/D converting section 3 includes a D/A converting unit 5, a comparator 7, an integrator 61, and a control unit 4.

The D/A converting unit 5 generates a comparative voltage corresponding to a target bit falling within the range from a most significant bit through a least significant bit.

The comparator 7 determines a value of the target bit by comparing a differential voltage V4 between the output signal V3 of the input switching unit 2 and the comparative voltage with a reference voltage V5.

The integrator 61 integrates a conversion error after the comparator 7 has performed a successive approximation operation through the least significant bit.

In a first conversion operation of A/D converting the first signal VA, the control unit 4 sets, based on a result of integration obtained by the integrator 61, the reference voltage V5 for use when the first signal VA is A/D converted next time. In other words, in the first conversion operation, the control unit 4 sets, based on a result of integration obtained by the integrator 61 after the first signal VA provided last time as the output signal V3 by the input switching unit 2 has been A/D converted, the reference voltage for use when the first signal VA to be provided next time as the output signal V3 by the input switching unit 2 is A/D converted. In a second conversion operation of A/D converting the second signal VB, the control unit 4 sets the reference voltage V5 at a constant voltage level. The A/D converter 1 according to this embodiment is a noise-shaping successive approximation register (SAR) A/D converter in which the integrator 61 is provided as an additional constituent element for the SAR A/D converting section 3.

As used herein, each of the first input terminal TA and the second input terminal TB may be, for example, a lead or an electrode of the A/D converter 1 as a package component. Alternatively, each of the first input terminal TA and the second input terminal TB may also be a part (terminal) to which an electric wire, for example, is connected or a part of a conductor formed as wiring on a circuit board.

The input switching unit 2 receives the first signal VA and the second signal VB as a plurality of analog input voltages and provides one output signal V3, selected from the group consisting of the first signal VA and the second signal VB, to the A/D converting section 3. The A/D converting section 3 performs A/D conversion of converting the output signal V3 of the input switching unit 2 into a multi-bit digital signal D1. When the A/D converting section 3 has performed the operation of converting the output signal V3, the input switching unit 2 newly selects another analog input voltage from the plurality of analog input voltages (i.e., the first signal VA and the second signal VB) and provides the selected analog input voltage as the output signal V3 to the A/D converting section 3 to have the output signal V3 A/D converted. That is to say, every time the input switching unit 2 provides either the first signal VA or the second signal VB as the output signal V3, the A/D converting section 3 A/D converts either the first signal VA or the second signal VB provided by the input switching unit 2. This enables the A/D converter 1 to A/D convert the first signal VA and the second signal VB, which are a plurality of analog input voltages, time-sequentially. As can be seen, the A/D converter 1 A/D converts the first signal VA time-sequentially. In the first conversion operation, the reference voltage for use when the first signal VA to be provided next time by the input switching unit 2 is A/D converted is set based on a result of integration obtained by the integrator 61 after the first signal VA provided last time by the input switching unit 2 has been A/D converted.

While the A/D converter 1 according to this embodiment is performing the first conversion operation of A/D converting the first signal VA, the reference voltage V5 for use when the first signal VA is A/D converted next time is set based on a result of integration obtained by the integrator 61 by integrating the conversion error of the A/D converting section 3. This achieves the advantage of improving the conversion accuracy. In addition, while the A/D converter 1 is performing the second conversion operation of A/D converting the second signal VB, the reference voltage V5 is set at a constant voltage level, thus requiring no integrator 61 for integrating the conversion error of the A/D converting section 3. Therefore, there is no need to provide as many integrators 61 as the plurality of signals, namely, first signal VA and the second signal VB, thus achieving the advantage of contributing to downsizing the A/D converter 1.

A sensor system 100 according to this embodiment includes: a sensor 200 that outputs a result of detection of a target event; and the A/D converter 1. A sensor signal provided by the sensor 200 is supplied as the first signal VA to the first input terminal TA.

This sensor system 200 includes the A/D converter 1 described above, thus contributing to reducing the overall size.

In the exemplary embodiment to be described below, a situation where the input switching unit 2 receives the first signal VA and the second signal VB as two analog input voltages and the A/D converter 1 time-sequentially A/D converts one output signal (signal to be converted) V3 selected from the group consisting of the first signal VA and the second signal VB will be described as an example. Note that the number of the analog input voltages (namely, the first signal VA and the second signal VB) supplied to the input switching unit 2 does not have to be two. Alternatively, three or more analog input voltages may be supplied to the input switching unit 2 and the A/D converter 1 may A/D convert three or more analog input voltages time-sequentially.

(2) Details (2.1) Configuration

A configuration for an A/D converter 1 and sensor system 100 according to this embodiment will now be described in detail with reference to FIGS. 1 and 2.

The A/D converter 1 according to this embodiment is a noise-shaping successive approximation register A/D converter. The A/D converter 1 includes the first input terminal TA, the second input terminal TB, the input switching unit 2, and the A/D converting section 3 as described above. In addition, the A/D converter 1 according to this embodiment further includes a filter circuit 9 and an output unit 10.

The first input terminal TA receives the first signal VA, and the second input terminal TB receives the second signal VB. The first signal VA is an output signal of a sensor 200 for detecting a target event (such as acceleration or angular velocity). The first signal VA has a frequency that may vary according to the target event and is a signal including a frequency component falling within the range from a few ten Hz to several kHz. Note that the sensor 200 does not have to be a sensor for detecting acceleration or angular velocity but may also be any other sensor such as a gyrosensor, a temperature sensor, or a pressure sensor. The second signal VB has a lower frequency than the first signal VA. In this embodiment, the second signal VB is a voltage signal defining a reference potential for the sensor 200 and is a DC signal having a substantially constant voltage value. Optionally, the reference potential may include noise with a relatively high frequency. In this case, if an offset voltage is superposed on the reference potential for the sensor 200, then the first signal V1 that is the output signal of the sensor 200 is a voltage in which the offset voltage is superposed on the result of detection by the sensor 200. Meanwhile, the second signal VB is a voltage signal defining a reference potential for the sensor 200. Thus, the second signal VB is a voltage corresponding to the offset voltage. In this case, an A/D converted value of the result of detection by the sensor 200 may be obtained by subtracting an A/D converted value of the second signal VB corresponding to the offset voltage from an A/D converted value of the first signal VA.

An output terminal TC of the input switching unit 2 is connected to one input terminal of the comparator 7. The input switching unit 2 includes a switch 21 connected between the first input terminal TA and the output terminal TC and a switch 22 connected between the second input terminal TB and the output terminal TC. The switches 21, 22 may be, for example, semiconductor switches such as CMOS transistors and are turned ON and OFF in response to control signals φA, φB supplied from the control unit 4. When the switch 21 turns ON and the switch 22 turns OFF, the first signal VA is provided as the output signal V3 from the input switching unit 2 to the A/D converting section 3. On the other hand, when the switch 21 turns OFF and the switch 22 turns ON, the second signal V2 is provided as the output signal V3 from the input switching unit 2 to the A/D converting section 3.

The A/D converting section 3 includes the D/A converting unit 5, the comparator 7, a reference voltage generating unit 6 including the integrator 61, and the control unit 4. The A/D converting section 3 further includes a reference voltage switching unit 8.

The control unit 4 may be implemented as a wired logic, for example. The control unit 4 makes the A/D converter 1 A/D convert the first signal VA and the second signal VB time-sequentially by controlling the operations of the input switching unit 2, the D/A converting unit 5, the reference voltage generating unit 6, the reference voltage switching unit 8, and the filter circuit 9. Alternatively, the control unit 4 may also be implemented as a computer system including one or more processors and a memory.

The D/A converting unit 5 may be a 12-bit D/A converting unit, for example, and may be implemented as a combination of a low-order D/A converting unit 51 for the least significant four bits and a high-order D/A converting unit 52 for the most significant eight bits.

The low-order D/A converting unit 51 includes a plurality of capacitors C1 and a plurality of switches Q1 provided for the plurality of capacitors C1, respectively. Each of the plurality of capacitors C1 has one terminal thereof connected to the output terminal TC of the input switching unit 2. The plurality of switches Q1 may be implemented as, for example, semiconductor switches such as CMOS transistors. The plurality of switches Q1 each selectively connect an associated one of the plurality of capacitors C1 to either a first voltage VH or a second voltage VL in accordance with the control signal S1 supplied from the control unit 4.

On the other hand, the high-order D/A converting unit 52 includes a plurality of capacitors C2 and dynamic element matching (DEM) circuits 53, 54. Each of the plurality of capacitors C2 has one terminal thereof connected to the output terminal TC of the input switching unit 2. The plurality of DEM circuits 53, 54 each selectively connect an associated one of the plurality of capacitors C2 to either the first voltage VH or the second voltage VL in accordance with the control signal S1 supplied from the control unit 4.

In this embodiment, a voltage switching circuit 55 is formed by the plurality of switches Q1 and the DEM circuits 53, 54. The plurality of switches Q1 and the DEM circuits 53, 54 selectively connect each of the plurality of capacitors C1, C2 to either the first voltage VH or the second voltage VL in accordance with the control signal S1 supplied from the control unit 4. This allows the D/A converting unit 5 to generate a comparative voltage with a desired voltage value. In this embodiment, the output terminal of the D/A converting unit 5 is connected, as well as the output terminal TC of the input switching unit 2, to one input terminal of the comparator 7. This allows the differential voltage V4 between the output signal V3 of the input switching unit 2 and the comparative voltage generated by the D/A converting unit 5 to be supplied to the one input terminal of the comparator 7.

The reference voltage generating unit 6 includes the integrator 61 and a capacitor C11.

Figure 2:
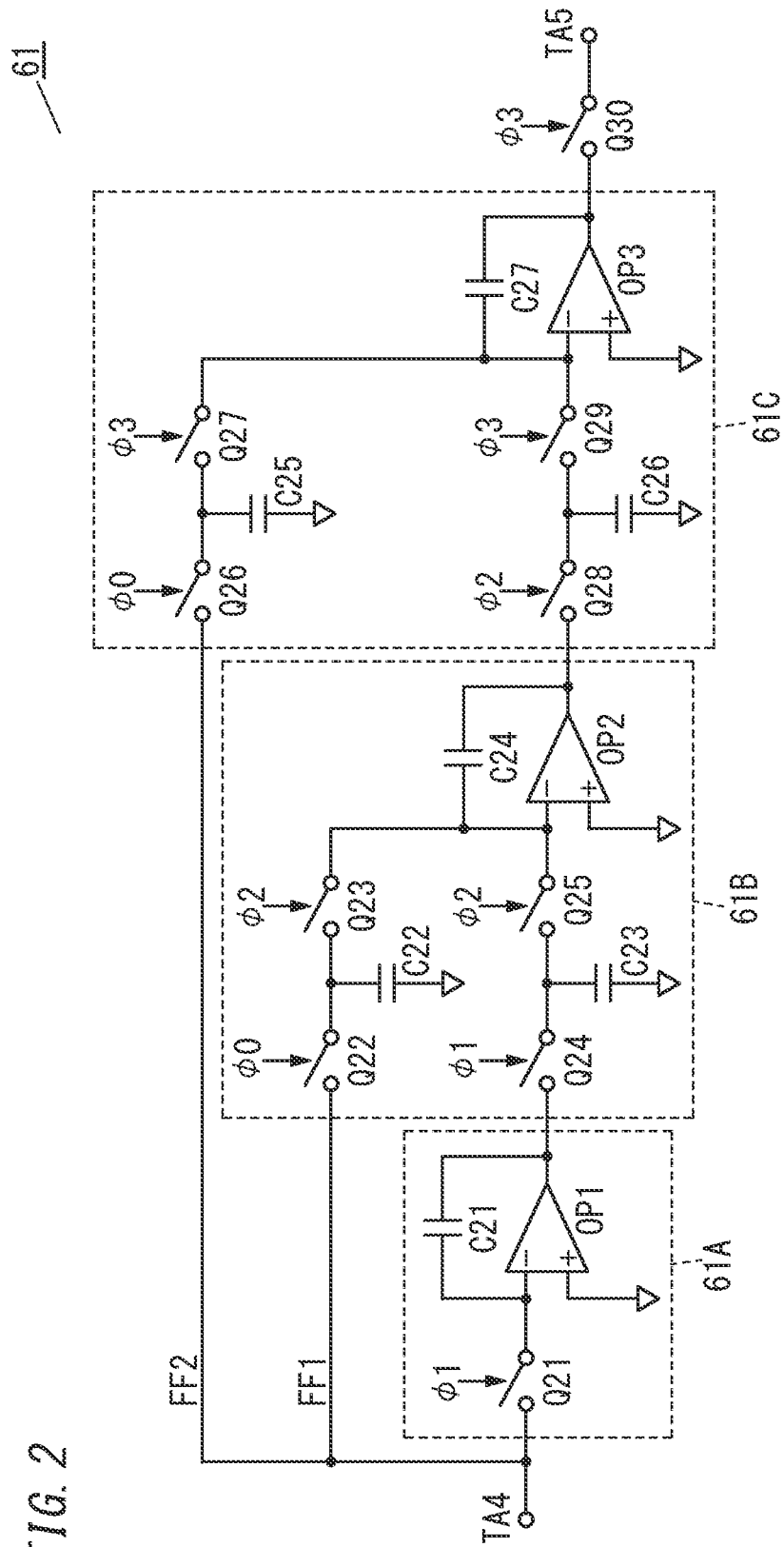
FIG. 2 is a schematic circuit diagram illustrating an exemplary integrator included in the A/D converter.

FIG. 2 illustrates a specific exemplary circuit configuration for the integrator 61. The integrator 61 according to this embodiment includes multiple stages of integrating circuits 61A, 61B, 61C for performing integration operations sequentially. These multiple stages of integrating circuits 61A-61C perform integration operations using operational amplifiers OP1-OP3, respectively.

The integrating circuit 61A is an integrating circuit on the first stage. The integrating circuit 61A includes an operational amplifier OP1, a capacitor C21, and a switch Q21. An inverting input terminal of the operational amplifier OP1 is connected to an input terminal TA4 of the integrator 61 via the switch Q21. The capacitor C21 is connected between the inverting input terminal and output terminal of the operational amplifier OP1. A non-inverting input terminal of the operational amplifier OP1 is connected to a reference potential for the A/D converter 1. In this embodiment, the integrating circuit 61A is formed by the operational amplifier OP1, a capacitor of the D/A converting unit 5 connected to the input terminal TA4, and the capacitor C21. The output terminal of the operational amplifier OP1 (i.e., an output terminal of the integrating circuit 61A) is connected to an input terminal of the integrating circuit 61B.

The integrating circuit 61B is an integrating circuit on the second stage. The integrating circuit 61B includes an operational amplifier OP2, capacitors C22-C24, and switches Q22-Q25. An inverting input terminal of the operational amplifier OP2 is connected to the input terminal TA4 of the integrator 61 via the switches Q22, Q23. In addition, the inverting input terminal of the operational amplifier OP2 is also connected to the output terminal of the integrating circuit 61A via the switches Q24, Q25. A non-inverting input terminal of the operational amplifier OP2 is connected to the reference potential for the A/D converter 1. In this embodiment, a node of connection between the switches Q22, Q23 is connected to the reference potential for the A/D converter 1 via the capacitor C22. A node of connection between the switches Q24, Q25 is connected to the reference potential for the A/D converter 1 via the capacitor C23. The capacitor C24 is connected between the inverting input terminal and output terminal of the operational amplifier OP2. The output terminal of the operational amplifier OP2 (i.e., an output terminal of the integrating circuit 61B) is connected to an input terminal of the integrating circuit 61C.

In this embodiment, a feed forward path FF1 is formed between the input terminal TA4 of the integrator 61 and the input terminal of the operational amplifier OP2 included in the integrating circuit 61B on the second stage. The differential voltage V4 supplied through the input terminal TA4 of the integrator 61 is sampled by the capacitor C22. As a result, the differential voltage V4 thus sampled is supplied to the operational amplifier OP2 of the integrating circuit 61B on the second stage.

The integrating circuit 61C is an integrating circuit on the third stage. The integrating circuit 61C includes an operational amplifier OP3, capacitors C25-C27, and switches Q26-Q29. An inverting input terminal of the operational amplifier OP3 is connected to the input terminal TA4 of the integrator 61 via the switches Q26, Q27. In addition, the inverting input terminal of the operational amplifier OP3 is also connected to the output terminal of the integrating circuit 61B (i.e., the output terminal of the operational amplifier OP2) via the switches Q28, Q29. A non-inverting input terminal of the operational amplifier OP3 is connected to the reference potential for the A/D converter 1. In this embodiment, a node of connection between the switches Q26, Q27 is connected to the reference potential for the A/D converter 1 via the capacitor C25. A node of connection between the switches Q28, Q29 is connected to the reference potential for the A/D converter 1 via the capacitor C26. The capacitor C27 is connected between the inverting input terminal and output terminal of the operational amplifier OP3.

In this embodiment, a feed forward path FF2 is formed between the input terminal TA4 of the integrator 61 and the input terminal of the operational amplifier OP3 included in the integrating circuit 61C on the third stage. The differential voltage V4 supplied through the input terminal TA4 of the integrator 61 is sampled by the capacitor C25. As a result, the differential voltage V4 thus sampled is supplied to the operational amplifier OP3 of the integrating circuit 61C on the third stage.

An output terminal of the integrating circuit 61C (i.e., an output terminal of the operational amplifier OP3) is electrically connected to an output terminal TA5 of the integrator 61 via a switch Q30. That is to say, the output terminal of the integrating circuit 61C is connected to the capacitor C11 via the switch Q30.

The plurality of switches Q21-Q30 may be implemented as, for example, semiconductor switches such as CMOS transistors. The switches Q22, Q26 are turned ON or OFF in response to a control signal φ0 supplied from the control unit 4. The switches Q21, Q24 are turned ON or OFF in response to a control signal φ1 supplied from the control unit 4. The switches Q23, Q25, Q28 are turned ON or OFF in response to a control signal φ2 supplied from the control unit 4. The switches Q27, Q29, Q30 are turned ON or OFF in response to a control signal φ3 supplied from the control unit 4.

As can be seen, in the example illustrated in FIG. 2, the three integrating circuits 61A, 61B, 61C are cascade connected in the integrator 61 and these integrating circuits 61A-61C on three stages perform integration operations sequentially, thereby realizing a noise shaping characteristic for shifting noise in a low-frequency band to a high-frequency band. In this case, the results of integration obtained by the integrator 61, i.e., the results of the integration operations that have been performed sequentially by the integrating circuits 61A-61C on the three stages, are stored in the capacitor C11 and the voltage across the capacitor C11 is output as the reference voltage V11. In the integrator 61 according to this embodiment, the three integrating circuits 61A, 61B, 61C are cascade connected. However, this is only an example and should not be construed as limiting. Alternatively, the number of stages of the integrating circuits may be changed as appropriate as long as there is at least one stage. In addition, in a situation where the number of stages of the integrating circuits is two or more, the feed forward path does not have to be formed between the input terminal TA4 of the integrator 61 and the one or more integrating circuits to be connected from the second stage and on. The feed forward path may be omitted as appropriate.

The reference voltage switching unit 8 selectively outputs, in accordance with a control signal supplied from the control unit 4, either the reference voltage V11 generated by the reference voltage generating unit 6 (i.e., the voltage across the capacitor C11) or the reference potential Vref for the A/D converting section 3 as the reference voltage V5 to the comparator 7. In a first state where the first signal VA is A/D converted, the reference voltage switching unit 8 outputs the reference voltage V11, generated by the reference voltage generating unit 6, as the reference voltage V5 to the comparator 7. On the other hand, in a second state where the second signal VB is A/D converted, the reference voltage switching unit 8 outputs the reference potential Vref for the A/D converting section 3, as the reference voltage V5 to the comparator 7.

The comparator 7 compares, on a target bit basis, the differential voltage V4 between the output signal V3 of the input switching unit 2 and the comparative voltage generated by the D/A converting unit 5 with the reference voltage V5 supplied via the reference voltage switching unit 8. The comparator 7 determines the value (which is either 0 or 1) of the target bit by comparing the differential voltage V4 with the reference voltage on a target bit basis.

In a first conversion operation of A/D converting the first signal VA, the control unit 4 controls the reference voltage switching unit 8 to have the reference voltage V11, generated by the reference voltage generating unit 6, supplied as the reference voltage V5 to the other input terminal of the comparator 7. Thus, in the first conversion operation, a result of integration, obtained by having the conversion error, remaining after the least significant bit has been converted when the first signal VA was A/D converted last time, integrated by the integrator 61 is used as the reference voltage, thus realizing a noise shaping characteristic for shifting noise in the low-frequency band to the high-frequency band.

On the other hand, in a second conversion operation of A/D converting the second signal VB, the control unit 4 controls the reference voltage switching unit 8 to have the reference potential Vref for the A/D converting section 3 supplied as the reference voltage V5 to the other input terminal of the comparator 7. The second signal VB has a lower frequency than the first signal VA. In this embodiment, the second signal VB is a reference potential (reference signal) for the A/D converter 1 which is a substantially constant voltage level. This enables obtaining a result of conversion with sufficiently high accuracy even without integrating the conversion error using the integrator 61. Thus, there is no need to provide, separately from the integrator 61, the capacitor C11, and a low-pass filter 91 (to be described later) for use to A/D convert the first signal VA, any other integrator, capacitor, or low-pass filter for use to A/D convert the second signal VB. Consequently, this contributes to downsizing the A/D converter 1, compared to providing as many integrators, capacitors, and low-pass filters as the plurality of signals (namely, the first signal VA and the second signal VB).

In addition, the control unit 4 also generates, based on the result of comparison made by the comparator 7 on the target bit, a control signal S1 to make the D/A converting unit 5 generate a comparative voltage for the bit next to the target bit and outputs the control signal S1 to the D/A converting unit 5 when performing the comparison operation on the next bit.

The filter circuit 9 includes the low-pass filter 91, an averaging filter 92, and a filter switching circuit 93.

In the first state where the first signal VA is A/D converted, the filter switching circuit 93 supplies a digital signal D1, provided by the A/D converting section 3, to the low-pass filter (LPF) 91. In the second state where the second signal VB is A/D converted, the filter switching circuit 93 supplies the digital signal D1, provided by the A/D converting section 3, to the averaging filter (AF) 92. Optionally, the A/D converter 1 may include a serial-parallel converter circuit for converting a serial digital signal provided by the A/D converting section 3 into a parallel digital signal. The digital signal that has been converted into the parallel digital signal may be supplied to the filter circuit 9.

The low-pass filter 91 attenuates an RF component of the digital signal D1 provided by the A/D converting section 3, i.e., the RF component of the digital signal D1 generated by A/D converting the first signal VA. The low-pass filter 91 is a digital filter having a low-pass filtering characteristic and outputs a digital signal D11 by attenuating the RF component of the digital signal D1 generated by A/D converting the first signal VA. The low-pass filter 91 may be a digital filter implemented as a wired logic, for example, but may also be implemented as a processor.

The averaging filter 92 performs averaging processing on the digital signal D1 provided by the A/D converting section 3, i.e., the digital signal D1 generated by A/D converting the second signal VB. That is to say, the sensor system 100 according to this embodiment further includes the averaging filter 92 for averaging the result of conversion performed on the second signal VB by the A/D converting section 3. The averaging filter 92 outputs, based on the results of A/D conversion that has been performed multiple times by the A/D converting section 3 on the second signal VB, a digital signal D2 which is an average value of the results of the A/D conversion performed multiple times. The averaging filter 92 performs the averaging processing by performing, for example, additions and integration and bit shifting. The averaging filter 92 may be implemented as a simpler circuit than the low-pass filter 91. The averaging filter 92 may be implemented as a wired logic, for example, but may also be implemented as a processor.

The output unit 10 outputs a digital signal representing the difference between the digital signal D11 provided by the low-pass filter 91 (i.e., a digital signal generated by A/D converting the first signal VA) and the digital signal D2 provided by the averaging filter 92 (i.e., a digital signal generated by A/D converting the second signal VB). That is to say, the sensor system 100 according to this embodiment further includes the output unit 10 for outputting the difference between the result of conversion performed by the A/D converting section 3 on the first signal VA and the average value provided by the averaging filter 92. In this embodiment, the first signal VA is the output signal of the sensor 200 and the second signal VB is a voltage signal representing a reference potential for the sensor 200 (i.e., an offset component). Thus, the output unit 10 outputs a digital signal corresponding to the output signal of the sensor 200 from which the offset component has been removed.

(2.2) Description of Operation

Next, it will be described with reference to FIGS. 1-4 and other drawings how the A/D converter 1 according to this embodiment operates. FIGS. 1 and 2 are schematic circuit diagrams of the A/D converter 1, of which the circuit configuration is illustrated in a simplified form with illustration of some circuit components thereof omitted.

Figure 3:
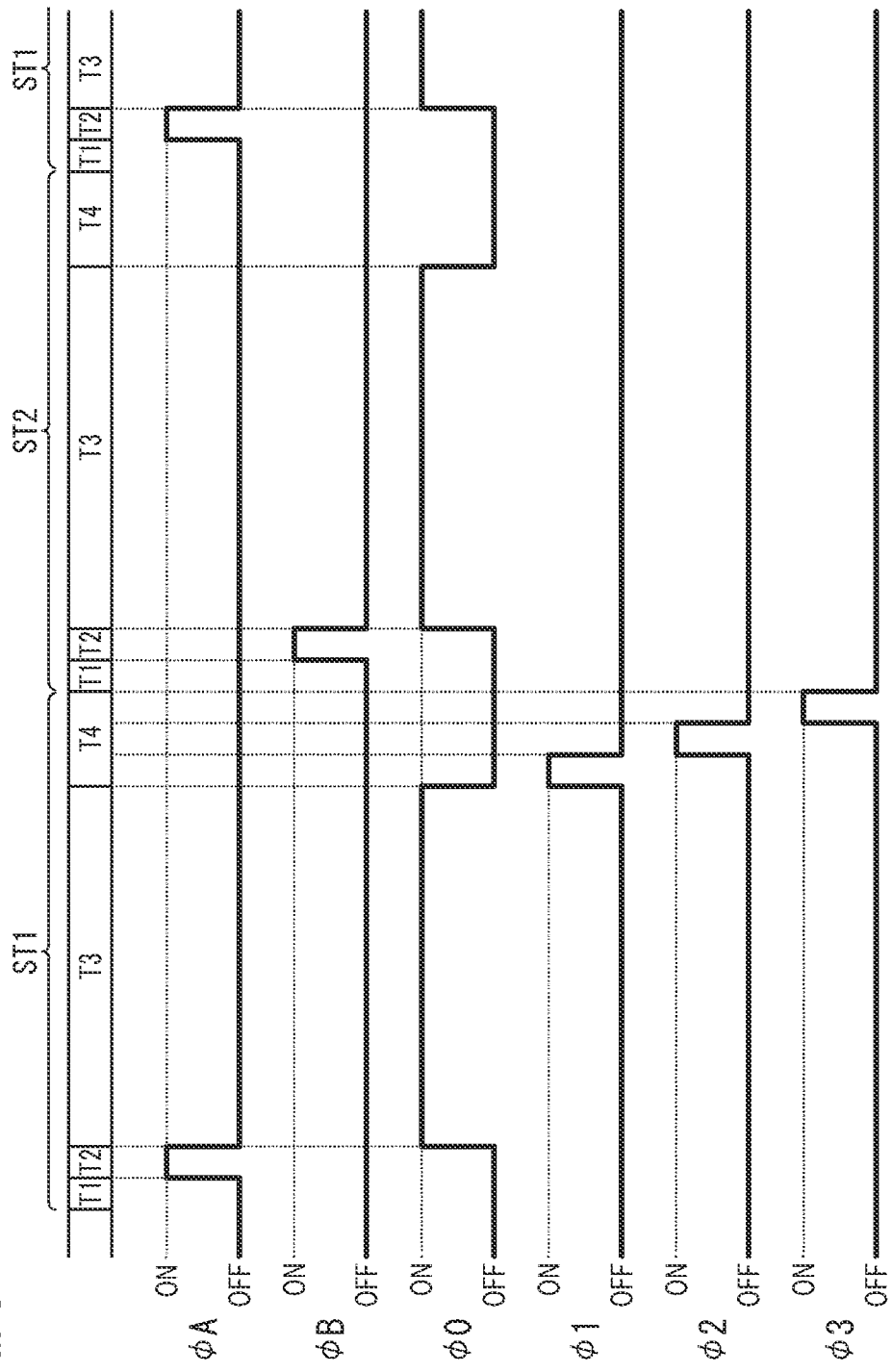
FIG. 3 is a timing chart illustrating how the A/D converter operates.
Figure 4:
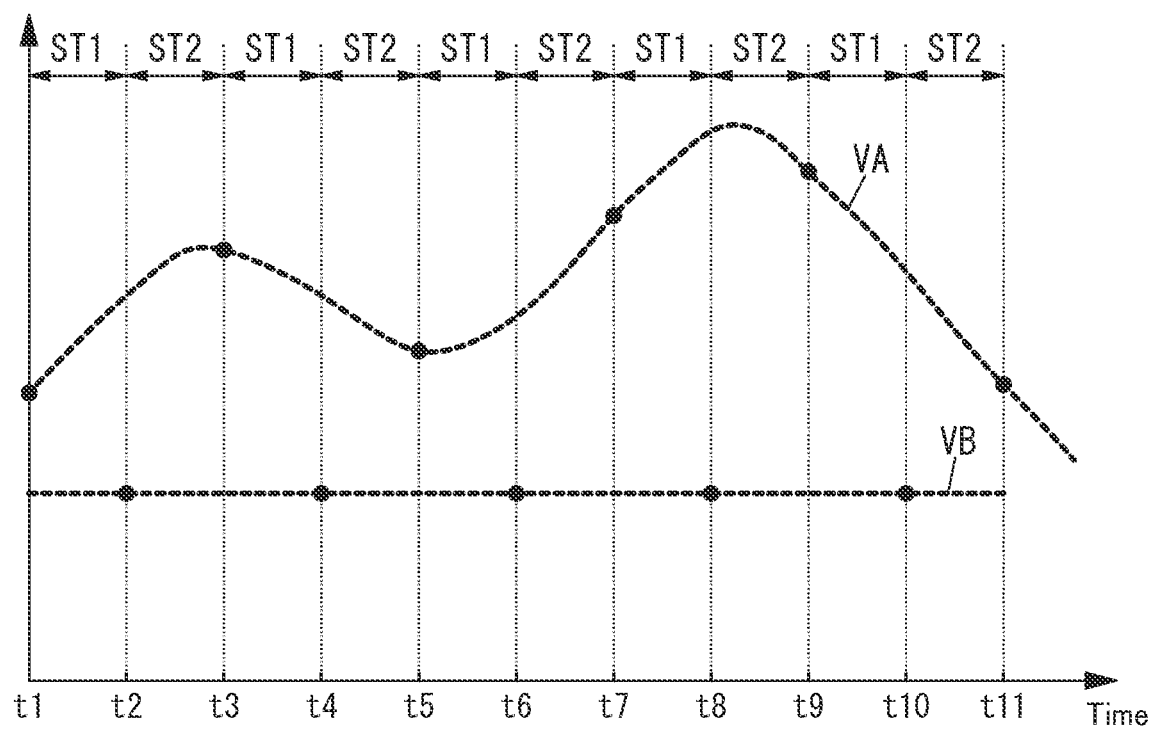
FIG. 4 shows an exemplary signal to be A/D converted by the A/D converter.

FIG. 3 is an exemplary timing chart illustrating how the A/D converter 1 shown in FIGS. 1 and 2 may operate. Note that FIG. 3 is a timing chart illustrating the operation of some components of the A/D converter 1. FIG. 4 is a graph illustrating a signal to be supplied to the A/D converting section 3.

A control signal φA is a control signal for the switch 21. A control signal φB is a control signal for the switch 22. Also, control signals φ0, φ1, φ2, φ3 are control signals for the switches Q21-Q30 included in the integrator 61. The control signals φA, φB, and φ0-φ3 are supplied from the control unit 4.

The control unit 4 A/D converts the first signal VA and the second signal VB time-sequentially by alternately setting a first conversion period ST1 in which the first signal VA is A/D converted (as the first conversion operation) and a second conversion period ST2 in which the second signal VB is A/D converted (as the second conversion operation). In the exemplary operation shown in FIG. 3, the frequency of occurrence at which the first signal VA is A/D converted is the same as the frequency of occurrence at which the second signal VB is A/D converted.

First, it will be described how the A/D converter 1 operates in the first conversion period ST1. During a reset period T1 of the first conversion period ST1, the control unit 4 controls the switch Q1 and the DEM circuits 53, 54 to perform a reset operation on the capacitors C1, C2 included in the D/A converting unit 5. In addition, in the first conversion period ST1, the control unit 4 controls the reference voltage switching unit 8 to have the reference voltage V11, generated by the reference voltage generating unit 6, supplied as the reference voltage V5 to the comparator 7. Furthermore, in the first conversion period ST1, the filter switching circuit 93 is switched such that the digital signal provided by the A/D converting section 3 is supplied to the low-pass filter 91. Note that in an initial state where the A/D converter 1 starts performing the A/D conversion, the voltage V11 across the capacitor C11 is close to the reference potential Vref.

When the reset operation has been performed on the capacitors C1, C2, the control unit 4 turns the switch 21 ON in the sampling period T2, thereby sampling the first signal VA received at the first input terminal TA and supplying the first signal VA as the output signal V3 to the D/A converting unit 5.

Thereafter, in an A/D conversion period T3, the control unit 4 makes the A/D converting section 3 perform the A/D conversion with the switches 21, 22 turned OFF.

First, the control unit 4 outputs, to the D/A converting unit 5, a control signal S1 which generates a comparative voltage ((VH−VL)/2) corresponding to a 12-bit digital value such as "100000000000," of which only the most significant bit is "1." At this time, the comparator 7 determines the value of the most significant bit as the target bit by comparing the differential voltage V4 between the output signal V3 (first signal VA) and the comparative voltage with the reference voltage V5.

In this case, if the differential voltage V4 is equal to or greater than the reference voltage V5, the comparator 7 sets the value of the most significant bit (target bit) at "1," for example. On the other hand, if the differential voltage V4 is less than the reference voltage V5, the comparator 7 sets the value of the most significant bit (target bit) at "0," for example. When determining the value of the bit next to the target bit, the control unit 4 generates, based on the result of comparison made by the comparator 7, a control signal S1 that determines the value of the comparative voltage to be generated by the D/A converting unit 5 and outputs the control signal S1 to the D/A converting unit 5.

For example, if the value of the most significant bit is "1," the control unit 4 outputs a control signal S1, which generates a comparative voltage (3(VH−VL)/4) corresponding to a digital value "110000000000" to the D/A converting unit 5 when determining the value of the bit next to the most significant bit. At this time, the comparator 7 determines the value of the target bit by comparing the differential voltage V4 between the output signal V3 (first signal VA) and the comparative voltage with the reference voltage V5. When finding the differential voltage V4 equal to or greater than the reference voltage V5, the comparator 7 sets the value of the (MSB−1) bit as the target bit at "1." On the other hand, when finding the differential voltage V4 less than the reference voltage V5, the comparator 7 sets the value of the (MSB−1) bit as the target bit at "0."

On the other hand, if the value of the most significant bit is "0," the control unit 4 outputs a control signal S1, which generates a comparative voltage ((VH−VL)/4) corresponding to a digital value "010000000000" to the D/A converting unit 5 when determining the value of the bit next to the most significant bit. At this time, the comparator 7 determines the value of the target bit by comparing the differential voltage V4 between the output signal V3 (first signal VA) and the comparative voltage with the reference voltage V5. When finding the differential voltage V4 equal to or greater than the reference voltage V5, the comparator 7 sets the value of the (MSB−1) bit as the target bit at "1." On the other hand, when finding the differential voltage V4 less than the reference voltage V5, the comparator 7 sets the value of the (MSB−1) bit as the target bit at "0."

The values of the respective bits are determined by making the A/D converting section 3 repeat such an operation from the most significant bit through the least significant bit. The multi-bit digital signal D1 representing the comparison results of respective bits, i.e., the digital signal D1 as bit sequence data in which the values of the respective bits from the most significant bit through the least significant bit are arranged, is output to the filter circuit 9. In the filter circuit 9, the digital signal D1 provided by the A/D converting section 3 is supplied by the filter switching circuit 93 to the low-pass filter 91, which outputs a digital signal D11 with noise in the high-frequency band reduced.

When the A/D converting section 3 has performed the operation of comparing the target bit through the least significant bit, the control unit 4 starts performing an operation for the integration period T4. In the integration period T4, the control unit 4 makes the integrator 61 perform an integration operation and then performs the operation of generating the reference voltage V11 for use when the first signal VA is A/D converted next time.

In the integration period T4, the control unit 4 first outputs a control signal φ0 to turn the switches Q22, Q26 OFF to the integrator 61, thereby turning the switches Q22, Q26 OFF. In this case, the switches Q22, Q26 are ON during the A/D conversion period T3. Thus, at the beginning of the integration period T4, the capacitors C22 and C25 have been charged with the differential voltage V4 (i.e., the voltage representing the conversion error) between the output signal V3 (first signal VA) and the comparative voltage at a point in time when the successive approximation processing is finished through the least significant bit.

In the integration period T4, the control unit 4 outputs a control signal φ1 to turn the switches Q21, Q24 ON substantially simultaneously with turning the switches Q22, Q26 OFF, thereby turning the switches Q21 and Q24 ON. As a result, the differential voltage V4 between the output signal V3 (first signal VA) and the comparative voltage at the point in time when the successive approximation processing is finished through the least significant bit is integrated by the integrating circuit 61A and the integrated value thus obtained is stored in the capacitor C23.

Next, the control unit 4 turns the switches Q21 and Q24 OFF, samples and holds, in the capacitor C23, the integrated value calculated by the integrating circuit 61A, and then outputs a control signal φ2 to turn the switches Q23, Q25, and Q28 ON, thereby turning the switches Q23, Q25, and Q28 ON. As a result, the integrated value sampled and held by the capacitor C23 is integrated by the integrating circuit 61B on the second stage. In addition, the differential voltage for the least significant bit that has been sampled and held in the capacitor C22 is supplied to the integrating circuit 61B through the feed forward path FF1 and integrated by the integrating circuit 61B. At this time, the integrated value calculated by the integrating circuit 61B is stored in the capacitor C26.

Next, the control unit 4 turns the switches Q23, Q25, and Q28 OFF, samples and holds, in the capacitor C26, the integrated value calculated by the integrating circuit 61B, and then outputs a control signal φ3 to turn the switches Q27, Q29, and Q30 ON, thereby turning the switches Q27, Q29, and Q30 ON. As a result, the integrated value sampled and held by the capacitor C26 is integrated by the integrating circuit 61C on the third stage. In addition, the differential voltage for the least significant bit that has been sampled and held in the capacitor C25 is supplied to the integrating circuit 61C through the feed forward path FF2 and integrated by the integrating circuit 61C. At this time, the integrated value calculated by the integrating circuit 61C is stored in the capacitor C11 via the switch Q30.

Next, the control unit 4 turns the switches Q27, Q29, and Q30 OFF and samples and holds, in the capacitor C11, the integrated value calculated by the integrating circuit 61C on the third stage. In this manner, a third-order integration operation is done by the reference voltage generating unit 6 and the third-order integrated value sampled and held in the capacitor C11 is fed back to the comparator 7 as the reference voltage V5 for use when the first signal VA is A/D converted next time. In other words, the result of integration obtained by the integrator 61 after the first signal VA has been A/D converted last time during the first conversion period ST1 is set as the reference voltage V5 for use when the first signal VA is A/D converted next time during the first conversion period ST1. Thus, a successive approximation register A/D converter 1 having a third-order noise shaping characteristic is provided.

Next, it will be described how the A/D converter 1 operates in the second conversion period ST2. Note that the operation of the A/D converter 1 during the second conversion period ST2 is different from its operation during the first conversion period ST1 in that the integrator 61 does not perform the operation of integrating the conversion error. In the sampling period T2 of the second conversion period ST2, the switch 22 is turned ON to have the second signal VB sampled and supplied to the D/A converting unit 5. Also, in the second conversion period ST2, the control unit 4 controls the reference voltage switching unit 8 to have the reference potential Vref supplied as the reference voltage V5 to the comparator 7 and the second signal VB is A/D converted. In addition, in the second conversion period ST2, the filter switching circuit 93 is switched such that the digital signal D1 provided by the A/D converting section 3 is supplied to the averaging filter 92. When the second signal VB has been A/D converted, the digital signal D1 generated by A/D converting the second signal VB is averaged by the averaging filter 92. As a result, a digital signal D2 as an average value of the digital signal D1 is output from the averaging filter 92.

Then, when the first signal VA and the second signal VB are A/D converted completely, the output unit 10 calculates the difference between a digital signal D11 of the first signal VA provided by the low-pass filter 91 and a digital signal D2 of the second signal VB provided by the averaging filter 92 and outputs a digital signal representing the difference.

In the A/D converter 1 according to this embodiment, the first conversion periods ST1 for A/D converting the first signal VA and the second conversion period ST2 for A/D converting the second signal VB alternate with each other as shown in FIG. 4 so that the first signal VA and the second signal VB are A/D converted alternately and time-sequentially.

In each second conversion period ST2 in which the second signal VB is A/D converted, the reference potential Vref is supplied as the reference voltage V5 to the comparator 7, and therefore, no integration operation is performed by the integrator 61 after the second signal VB has been A/D converted. That is to say, in the first conversion operation, the integration period T4 in which the integrator 61 performs the integration operation is set to follow the A/D conversion period T3 in which the A/D converting section 3 A/D converts the output signal V3 (first signal VA). On the other hand, in the second conversion operation, the integrator 61 performs no integration operation after the A/D conversion period T3. This enables cutting down the power consumption of the A/D converter 1.

(3) Variations

Note that the embodiment described above is only an exemplary one of various embodiments of the present disclosure and should not be construed as limiting. Rather, the exemplary embodiment may be readily modified in various manners depending on a design choice or any other factor without departing from the scope of the present disclosure.

Next, variations of the exemplary embodiment will be enumerated one after another. Note that the variations to be described below may be adopted in combination as appropriate.

(3.1) First Variation

In an A/D converter 1 according to a first variation, the integration period T4 is omitted from the second conversion period ST2, which is a difference from the exemplary embodiment described above. The A/D converter 1 according to the first variation has the same configuration as the A/D converter 1 according to the exemplary embodiment described above. Thus, any constituent element of this first variation, having the same function as a counterpart of the exemplary embodiment described above, will be designated by the same reference numeral as that counterpart's, and description thereof will be omitted herein.

Figure 5:
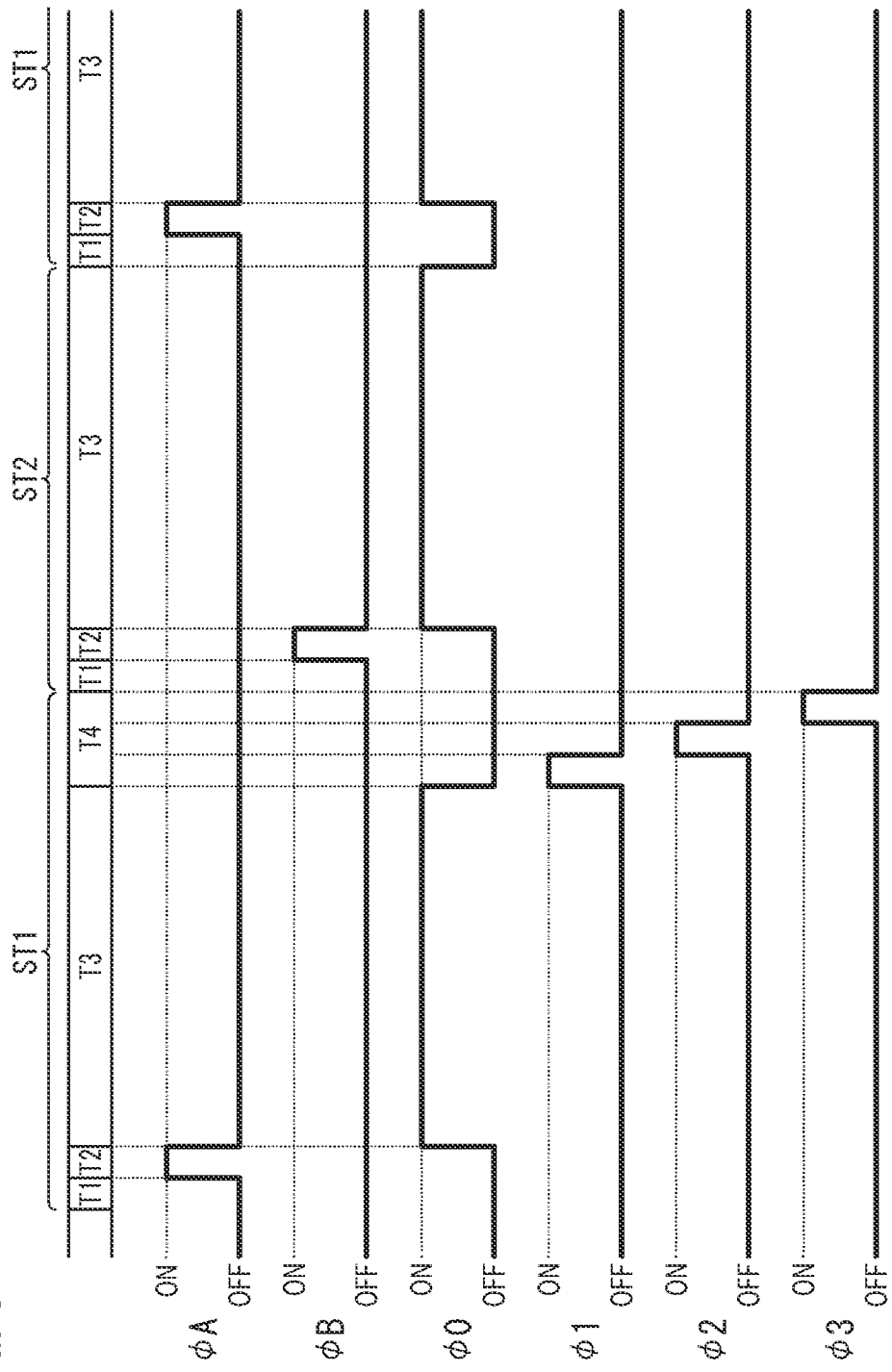
FIG. 5 is a timing chart illustrating how an A/D converter according to a first variation of the exemplary embodiment of the present disclosure operates.

FIG. 5 is an exemplary timing chart illustrating how the A/D converter 1 according to the first variation operates. Note that FIG. 5 is a timing chart illustrating the operation of some components of the A/D converter 1.

In the A/D converter 1 according to the first variation, the control unit 4 controls the conversion operation by the A/D converting section 3 such that as soon as the A/D conversion period T3 ends in the second conversion period ST2, the A/D converting section 3 starts A/D converting the next output signal V3 as shown in FIG. 5. That is to say, the control unit 4 controls the conversion operation by the A/D converting section 3 to make the A/D converting section 3 start A/D converting the next output signal V3 at the timing when the A/D conversion period T3 ends in the second conversion period ST2. This enables shortening, by the integration period T4 omitted, the time for converting the first signal VA and the second signal VB (i.e., the total time of the first conversion period ST1 and the second conversion period ST2).

(3.2) Second Variation

In an A/D converter 1 according to a second variation, a frequency of occurrence at which the A/D converting section 3 A/D converts the first signal VA is different from a frequency of occurrence at which the A/D converting section 3 A/D converts the second signal VB, which is a difference from the A/D converter 1 according to the exemplary embodiment described above. The A/D converter 1 according to the second variation has the same configuration as the A/D converter 1 according to the exemplary embodiment described above. Thus, any constituent element of this second variation, having the same function as a counterpart of the exemplary embodiment described above, will be designated by the same reference numeral as that counterpart's, and description thereof will be omitted herein.

Figure 6:
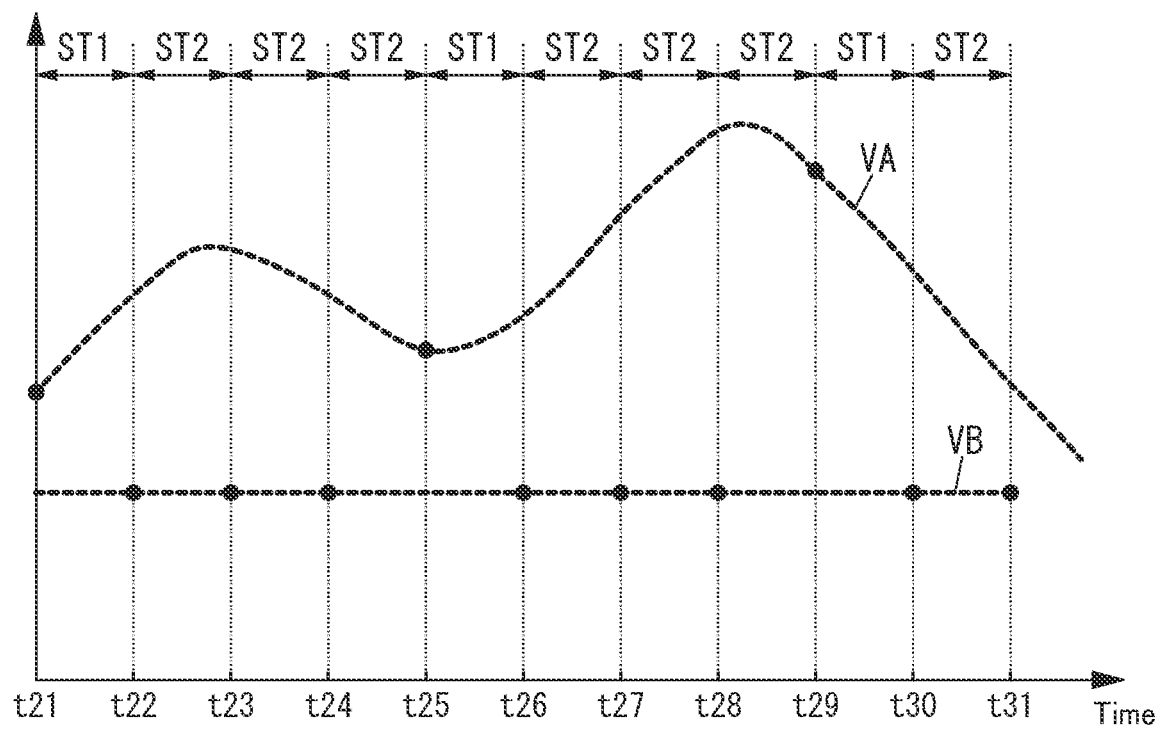
FIG. 6 shows an exemplary signal to be A/D converted by an A/D converter according to a second variation of the exemplary embodiment of the present disclosure.

In the A/D converter 1 according to the second variation, the control unit 4 controls the A/D converting section 3 and other components such that after the first conversion operation of A/D converting the first signal VA has been performed once, the second conversion operation of A/D converting the second signal VB is repeated three times and then the first conversion operation of A/D converting the first signal VA is performed once, as shown in FIG. 6, for example. Thus, a single conversion cycle is formed of one first conversion period ST1 for A/D converting the first signal VA and three second conversion periods ST2 for A/D converting the second signal VB. The control unit 4 controls the A/D converting section 3 to have this conversion cycle repeated a number of times.

In the example illustrated in FIG. 6, after the first signal VA has been A/D converted once, the second signal VB will be A/D converted three times before the first signal VA is A/D converted next time. According to the exemplary embodiment described above, a digital signal generated by A/D converting the second signal VB is averaged by the averaging filter 92. In a situation where the averaging filter 92 averages twelve digital signals and outputs their average, for example, the time it takes for generating twelve digital signals and calculating the average of the twelve digital signals may be shortened by A/D converting the second signal VB at a higher frequency of occurrence than the first signal VA.

In the example illustrated in FIG. 6, after the first signal VA has been A/D converted once, the second signal VB will be A/D converted three times before the first signal VA is A/D converted next time. However, the number of times the second signal VB is A/D converted during the interval does not have to be three but may also be two or four or more. Alternatively, the first signal VA may be A/D converted at a higher frequency of occurrence than the second signal VB conversely from the example illustrated in FIG. 6.

(3.3) Third Variation

Figure 7:
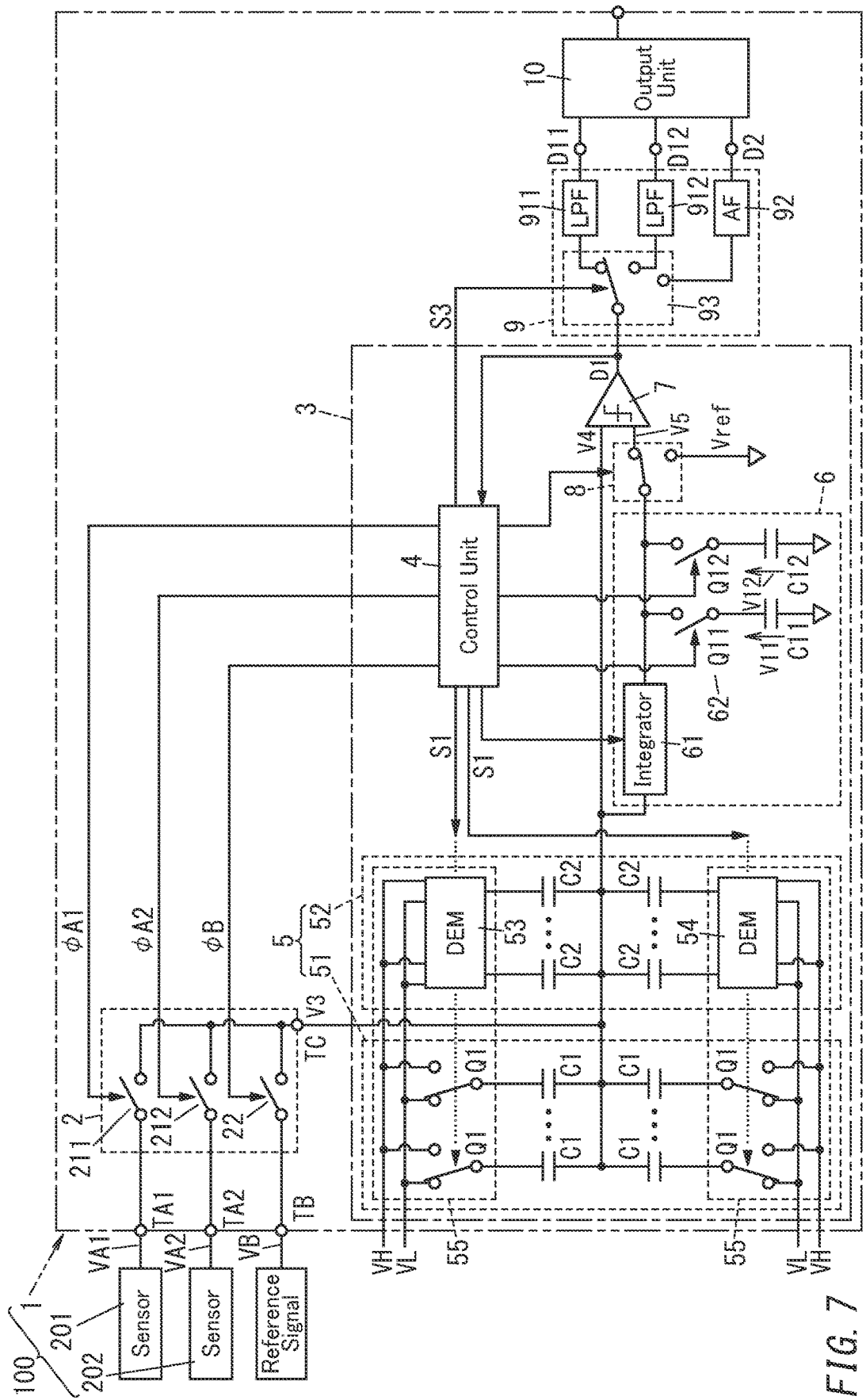
FIG. 7 is a schematic circuit diagram of an A/D converter according to a third variation of the exemplary embodiment of the present disclosure.

An A/D converter 1 according to a third variation is configured to A/D convert a plurality of (e.g., two) first signals VA1, VA2 as shown in FIG. 7, which is a difference from the exemplary embodiment described above. Note that any constituent element of the A/D converter 1 according to this third variation, having the same function as a counterpart of the A/D converter 1 according to the exemplary embodiment described above, will be designated by the same reference numeral as that counterpart's, and description thereof will be omitted herein.

The A/D converter 1 according to the third variation includes a plurality of (e.g., two) first input terminals TA1, TA2 which receive a plurality of (e.g., two) first signals VA1, VA2, respectively. The first input terminal TA1 receives an output signal of a sensor 201 as the first signal VA1. The first input terminal TA2 receives an output signal of a sensor 202 as the first signal VA2. The input switching unit 2 includes a switch 211 connected between the first input terminal TA1 and the output terminal TC, a switch 212 connected between the first input terminal TA2 and the output terminal TC, and the switch 22 connected between the second input terminal TB and the output terminal TC. The switches 211, 212, 22 are turned ON and OFF in response to control signals φA1, φA2, and φB supplied from the control unit 4. In accordance with the control signals φA1, φA2, and φB supplied from the control unit 4, the input switching unit 2 supplies one signal, selected from the group consisting of the plurality of (e.g., two) first signals VA1, VA2 and the second signal VB, as the output signal V3 to the A/D converting section 3. This enables the A/D converter 1 according to the third variation to A/D convert the plurality of first signals VA1, VA2.

In the A/D converter 1 according to the third variation, the reference voltage generating unit 6 includes a plurality of (e.g., two) capacitors C11, C12 that store integrated values corresponding to the plurality of (e.g., two) first signals VA1, VA2, respectively. The capacitor C11 is connected to the output terminal of the integrator 61 and to the input terminal of the reference voltage switching unit 8 via the switch Q11. The capacitor C12 is connected to the output terminal of the integrator 61 and to the input terminal of the reference voltage switching unit 8 via the switch Q12. These switches Q11, Q12 are turned ON and OFF in response to a control signal supplied from the control unit 4.

The sensor system 100 includes two low-pass filters (LPFs) 911, 912 associated with the two first signals VA1, VA2, respectively.

In the first conversion operation of A/D converting the first signal VA1, the control unit 4 turns the switch 211 ON and turns the switches 212, 22 OFF to provide the first signal VA1 as the output signal V3 to the A/D converting section 3. Meanwhile, the control unit 4 turns the switch Q11 ON and turns the switch Q12 OFF to make the capacitor C11 store an integrated value calculated by integrating the conversion error of the A/D converting section 3 in the integration period T4. Thus, the integrated value of the conversion error involved with the A/D conversion of the first signal VA1 is stored in the capacitor C11 and the reference voltage generating unit 6 outputs the voltage across the capacitor C11 as the reference voltage V11. Then, the reference voltage V11 is used as the reference voltage V5 when the first signal VA1 is A/D converted next time. This achieves the advantage of improving the conversion accuracy of the first signal VA1. Then, the control unit 4 controls the filter switching circuit 93 to have the digital signal D1 that has been A/D converted by the A/D converting section 3 supplied to the low-pass filter 911 associated with the first signal VA1. Thus, a digital signal D11, of which the RF component has been filtered out, is supplied to the output unit 10. At this time, the output unit 10 calculates the difference between the digital signal D11 generated by A/D converting the first signal VA1 and the digital signal D2 representing the average of the second signal V2 supplied from the averaging filter 92 and outputs the difference. Thus, the first signal VA1 may be output with an offset component thereof removed.

On the other hand, in the first conversion operation of A/D converting the first signal VA2, the control unit 4 turns the switch 212 ON and turns the switch 211, 22 OFF to provide the first signal VA2 as the output signal V3 to the A/D converting section 3. Meanwhile, the control unit 4 turns the switch Q12 ON and turns the switch Q11 OFF to make the capacitor C12 store an integrated value calculated by integrating the conversion error of the A/D converting section 3 in the integration period T4. Thus, the integrated value of the conversion error involved with the A/D conversion of the first signal VA2 is stored in the capacitor C12 and the reference voltage generating unit 6 outputs the voltage across the capacitor C12 as the reference voltage V12. Then, the reference voltage V12 is used as the reference voltage V5 when the first signal VA2 is A/D converted next time. This achieves the advantage of improving the conversion accuracy of the first signal VA2. Then, the control unit 4 controls the filter switching circuit 93 to have the digital signal D1 that has been A/D converted by the A/D converting section 3 supplied to the low-pass filter 912 associated with the first signal VA2. Thus, a digital signal D12, of which the RF component has been filtered out, is supplied to the output unit 10. At this time, the output unit 10 calculates the difference between the digital signal D12 generated by A/D converting the first signal VA2 and the digital signal D2 representing the average of the second signal V2 supplied from the averaging filter 92 and outputs the difference. Thus, the first signal VA2 may be output with an offset component thereof removed.

In this variation, the A/D converter 1 A/D converts the two first signals VA1, VA2. However, this is only an example and should not be construed as limiting. Alternatively, the A/D converter 1 may also be configured to A/D convert three or more first signals VA. In that case, the A/D converter 1 may include three or more capacitors for holding the results of integration by the integrator 61 in association with the three or more first signals VA.

Also, in this variation, two low-pass filters 911, 912 are provided in association with the two first signals VA1, VA2, respectively. Then, the filter switching circuit 93 supplies the result of conversion obtained by the A/D converting section 3 to the low-pass filter 911 or 912 associated with the first signal VA1 or VA2 to be converted, thereby reducing noise in the high-frequency band. As can be seen, a plurality of low-pass filters 911, 912 are provided in association with the plurality of first signals VA1, VA2. This achieves the advantage of making the low-pass filters 911, 912 designable according to the frequencies of their associated first signals VA1, VA2. This enables, even if the plurality of first signals VA1, VA2 have mutually different frequencies, outputting digital signals D11, D12 generated by converting the plurality of first signals VA1, VA2 into respective digital values.

(3.4) Other Variations

In the exemplary embodiment described above, the circuit configurations described for the D/A converting unit 5, the integrator 61, and other components are only examples and may be modified as appropriate.

In the exemplary embodiment described above, the first signals VA, VA1, VA2 to be supplied to the input terminals TA, TA1, TA2 are output signals of various types of sensors 200 such as acceleration sensors, angular velocity sensors, gyrosensors, or pressure sensors. However, this is only an example and should not be construed as limiting. Alternatively, the first signals VA, VA1, VA2 may also be voltage signals other than the output signals of such sensors 200. Meanwhile, the second signal VB supplied to the second input terminal TB does not have to be a reference signal representing a reference potential for the sensor 200 but may also be a voltage signal other than the reference signal.

In the exemplary embodiment described above, the input switching unit 2 may be implemented as, for example, a multiplexor.

In the exemplary embodiment described above, the signal processor circuit is illustrated as having a single end configuration in the exemplary circuits shown in FIGS. 1, 2, and 7. Alternatively, part or all of the signal processor circuit may also have a differential configuration.

Furthermore, in the foregoing description of embodiments, if one of two values being compared with each other (e.g., when the differential voltage V4 is compared with the reference voltage) is "equal to or greater than" the other, this phrase may herein cover both a situation where these two values are equal to each other and a situation where one of the two values is greater than the other. However, this should not be construed as limiting. Alternatively, the phrase "equal to or greater than" may also be a synonym of the phrase "greater than" that covers only a situation where one of the two values is over the other. That is to say, it is arbitrarily changeable, depending on selection of the reference voltage or any preset value, whether or not the phrase "equal to or greater than" covers the situation where the two values are equal to each other. Therefore, from a technical point of view, there is no difference between the phrase "equal to or greater than" and the phrase "greater than." Similarly, the phrase "less than" may be a synonym of the phrase "equal to or less than" as well.

(Recapitulation)

As can be seen from the foregoing description, an A/D converter (1) according to a first aspect includes a first input terminal (TA), a second input terminal (TB), an input switching unit (2), and a successive approximation register A/D converting section (3). The first input terminal (TA) receives a first signal (VA). The second input terminal (TB) receives a second signal (VB). The input switching unit (2) provides an output signal (V3) selected from the group consisting of the first signal (VA) received at the first input terminal (TA) and the second signal (VB) received at the second input terminal (TB). The A/D converting section (3) performs A/D conversion of converting the output signal (V3) of the input switching unit (2) into a multi-bit digital signal. The A/D converting section (3) includes a D/A converting unit (5), a comparator (7), an integrator (61), and a control unit (4). The D/A converting unit (5) generates a comparative voltage corresponding to a target bit falling within a range from a most significant bit through a least significant bit. The comparator (7) determines a value of the target bit by comparing a differential voltage (V4) between the output signal (V3) of the input switching unit (2) and the comparative voltage with a reference voltage (V5). The integrator (61) integrates a conversion error after the comparator (7) has performed a successive approximation operation through the least significant bit. In a first conversion operation of A/D converting the first signal (VA), the control unit (4) sets, based on a result of integration obtained by the integrator (61) after the first signal (VA) provided last time as the output signal (V3) by the input switching unit (2) has been A/D converted, the reference voltage (V5) for use when the first signal (VA) to be provided next time as the output signal (V3) by the input switching unit (2) is A/D converted. In a second conversion operation of A/D converting the second signal (VB), the control unit (4) sets the reference voltage (V5) at a constant voltage level.

According to this aspect, in the first conversion operation, the reference voltage (V5) for use when the first signal (VA) is A/D converted next time is set based on a result of integration obtained by the integrator (61) by integrating the conversion error of the A/D converting section (3). This achieves the advantage of improving the conversion accuracy. In addition, in the second conversion operation, the reference voltage (V5) is set at a constant voltage level, thus requiring no integrator (61) for integrating the conversion error of the A/D converting section (3). Therefore, there is no need to provide as many integrators (61) as the plurality of signals, namely, the first signal (VA) and the second signal (VB), thus achieving the advantage of contributing to downsizing the A/D converter (1).

In an A/D converter (1) according to a second aspect, which may be implemented in conjunction with the first aspect, in the first conversion operation, an integration period (T4) during which the integrator (61) performs an integration operation is set to follow a conversion period (T3) during which the A/D converting section (3) A/D converts the output signal (V3). In the second conversion operation, the integrator (61) performs no integration operation after the conversion period (T3).

According to this aspect, in the second conversion operation, the integrator (61) performs no integration operation after the conversion period (T3), thus enabling cutting down the power consumption.

In an A/D converter (1) according to a third aspect, which may be implemented in conjunction with the first or second aspect, in the second conversion operation, the A/D converting section (3) starts A/D converting the output signal (V3) for the next time when the conversion period (T3) ends.

According to this aspect, in the second conversion operation, there is no period for the integrator (61) to perform the integration operation after the conversion period (T3), thus shortening the time it takes to have the first conversion operation and the second conversion operation done.

In an A/D converter (1) according to a fourth aspect, which may be implemented in conjunction with any one of the first to third aspects, a frequency of occurrence at which the A/D converting section (3) A/D converts the first signal (VA) is different from a frequency of occurrence at which the A/D converting section (3) A/D converts the second signal (VB).

This aspect allows the first signal (VA) and the second signal (VB) to be A/D converted at different frequencies of occurrence.

In an A/D converter (1) according to a fifth aspect, which may be implemented in conjunction with any one of the first to fourth aspects, the second signal (VB) has a lower frequency than the first signal (VA).

This aspect allows the integration operation by the integrator (61) to be omitted for the second signal (VB) having a lower frequency than the first signal (VA).

An A/D converter (1) according to a sixth aspect, which may be implemented in conjunction with any one of the first to fifth aspects, includes a plurality of the first input terminals (TA1, TA2) that receive a plurality of the first signals (VA1, VA2), respectively. The input switching unit (2) provides the output signal (V3), which is a signal selected from the group consisting of the plurality of the first signals (VA1, VA2) and the second signal (VB), to the A/D converting section (3).

This aspect enables A/D converting a plurality of first signals (VA1, VA2).

In an A/D converter (1) according to a seventh aspect, which may be implemented in conjunction with any one of the first to sixth aspects, the integrator (61) includes a plurality of capacitors (C11, C12) that hold the integrated values in association with a plurality of the first signals (VA1, VA2), respectively.

According to this aspect, a plurality of capacitors (C11, C12) that hold the integrated values are provided for a plurality of the first signals (VA1, VA2), respectively. This achieves the advantage of improving the A/D conversion accuracy of the plurality of first signals (VA1, VA2).

A sensor system (100) according to an eighth aspect includes: a sensor (200) that outputs a result of detection of a target event; and the A/D converter (1). A sensor signal provided by the sensor (200) is supplied as the first signal (VA) to the first input terminal (TA).

This aspect enables providing a sensor system (100) including an A/D converter (1) that may have a reduced size.

A sensor system (100) according to a ninth aspect, which may be implemented in conjunction with the eighth aspect, further includes an averaging filter (92) that averages a result of conversion performed on the second signal (VB) by the A/D converting section (3).

This aspect enables reducing the conversion error of the second signal (VB) by making the averaging filter (92) average the result of conversion of the second signal (VB).

A sensor system (100) according to a tenth aspect, which may be implemented in conjunction with the ninth aspect, further includes an output unit (10) that outputs a difference between a result of conversion performed on the first signal (VA) by the A/D converting section (3) and an average value provided by the averaging filter (92).

This aspect enables outputting the difference between the result of conversion of the first signal (VA) and the average value provided by the averaging filter (92).

Note that the constituent elements according to the second to seventh aspects are not essential constituent elements for the A/D converter (1) but may be omitted as appropriate.

Also, note that these are not the only aspects of the present disclosure but various configurations (including their variations) of the A/D converter (1) according to the exemplary embodiment described above may also be implemented as, for example, a method for controlling the A/D converter (1), a (computer) program, or a non-transitory storage medium on which the program is stored.

Note that the constituent elements according to the ninth and tenth aspects are not essential constituent elements for the sensor system (100) but may be omitted as appropriate.

REFERENCE SIGNS LIST

1 A/D Converter
2 Input Switching Unit
3 A/D Converting Section
5 D/A Converting Unit
7 Comparator
10 Output Unit
61 Integrator
92 Averaging Filter
100 Sensor System
200 Sensor
T3 Conversion Period
T4 Integration Period
TA, TA1, TA2 First Input Terminal
TB Second Input Terminal
V3 Output Signal
V4 Differential Voltage
V5 Reference Voltage
VA, VA1, VA2 First Signal
VB Second Signal

The invention claimed is:

1. An A/D converter comprising:
a first input terminal configured to receive a first signal;
a second input terminal configured to receive a second signal;
an input switching unit configured to provide an output signal selected from the group consisting of the first signal received at the first input terminal and the second signal received at the second input terminal; and
an A/D converting section configured to perform A/D conversion of converting the output signal of the input switching unit into a multi-bit digital signal, the A/D converting section being a successive approximation register A/D converting section,
the A/D converting section including:
a D/A converting unit configured to generate a comparative voltage corresponding to a target bit falling within a range from a most significant bit through a least significant bit;
a comparator configured to determine a value of the target bit by comparing a differential voltage between the output signal of the input switching unit and the comparative voltage with a reference voltage; and
an integrator configured to integrate a conversion error after the comparator has performed a successive approximation operation through the least significant bit; and
a control unit,
the control unit being configured to, in a first conversion operation of A/D converting the first signal, set, based on a result of integration obtained by the integrator after the first signal provided last time as the output signal by the input switching unit has been A/D converted, the reference voltage for use when the first signal to be provided next time as the output signal by the input switching unit is A/D converted,
the control unit being also configured to, in a second conversion operation of A/D converting the second signal, set the reference voltage at a constant voltage level.

2. The A/D converter of claim 1, wherein
in the first conversion operation, an integration period during which the integrator performs an integration operation is set to follow a conversion period during which the A/D converting section A/D converts the output signal, and
in the second conversion operation, the integrator performs no integration operation after the conversion period.

3. The A/D converter of claim 1, wherein
in the second conversion operation, the A/D converting section starts A/D converting the output signal for the next time when the conversion period ends.

4. The A/D converter of claim 1, wherein
a frequency of occurrence at which the A/D converting section A/D converts the first signal is different from a frequency of occurrence at which the A/D converting section A/D converts the second signal.

5. The A/D converter of claim 1, wherein
the second signal has a lower frequency than the first signal.

6. The A/D converter of claim 1, comprising a plurality of the first input terminals configured to receive a plurality of the first signals, respectively, wherein the input switching unit is configured to provide the output signal, which is a signal selected from the group consisting of the plurality of the first signals and the second signal, to the A/D converting section.

7. The A/D converter of claim 1, wherein
the integrator includes a plurality of capacitors configured to hold the integrated values in association with a plurality of the first signals, respectively.

8. A sensor system comprising:
a sensor configured to output a result of detection of a target event; and
the A/D converter of claim 1,
a sensor signal provided by the sensor being supplied as the first signal to the first input terminal.

9. The sensor system of claim 8, further comprising an averaging filter configured to average a result of conversion performed on the second signal by the A/D converting section.

10. The sensor system of claim 9, further comprising an output unit configured to output a difference between a result of conversion performed on the first signal by the A/D converting section and an average value provided by the averaging filter.

11. The A/D converter of claim 2, wherein
in the second conversion operation, the A/D converting section starts A/D converting the output signal for the next time when the conversion period ends.

12. The A/D converter of claim 2, wherein
a frequency of occurrence at which the A/D converting section A/D converts the first signal is different from a frequency of occurrence at which the A/D converting section A/D converts the second signal.

13. The A/D converter of claim 3, wherein
a frequency of occurrence at which the A/D converting section A/D converts the first signal is different from a frequency of occurrence at which the A/D converting section A/D converts the second signal.

14. The A/D converter of claim 2, wherein
the second signal has a lower frequency than the first signal.

15. The A/D converter of claim 3, wherein
the second signal has a lower frequency than the first signal.

16. The A/D converter of claim 4, wherein
the second signal has a lower frequency than the first signal.

17. The A/D converter of claim 2, comprising a plurality of the first input terminals configured to receive a plurality of the first signals, respectively, wherein
the input switching unit is configured to provide the output signal, which is a signal selected from the group consisting of the plurality of the first signals and the second signal, to the A/D converting section.

18. The A/D converter of claim 2, comprising a plurality of the first input terminals configured to receive a plurality of the first signals, respectively, wherein
the input switching unit is configured to provide the output signal, which is a signal selected from the group consisting of the plurality of the first signals and the second signal, to the A/D converting section.

19. The A/D converter of claim 3, comprising a plurality of the first input terminals configured to receive a plurality of the first signals, respectively, wherein
the input switching unit is configured to provide the output signal, which is a signal selected from the group consisting of the plurality of the first signals and the second signal, to the A/D converting section.

20. The A/D converter of claim 4, comprising a plurality of the first input terminals configured to receive a plurality of the first signals, respectively, wherein
the input switching unit is configured to provide the output signal, which is a signal selected from the group consisting of the plurality of the first signals and the second signal, to the A/D converting section.

* * * * *